United States Patent [19]

Suzuki et al.

[11] Patent Number: 4,997,724
[45] Date of Patent: Mar. 5, 1991

[54] PROCESS FOR SURFACE TREATMENT OF MOLDINGS OF LIQUID-CRYSTALLINE POLYESTER RESIN

[75] Inventors: Yoshiharu Suzuki, Ihara; Toshiro Murao, Fuji; Michiaki Ogura, Shimizu, all of Japan

[73] Assignee: Polyplastics Co., Ltd., Osaka, Japan

[21] Appl. No.: 198,255

[22] Filed: May 25, 1988

[30] Foreign Application Priority Data

Oct. 2, 1987 [JP] Japan ................................. 62-249196
Dec. 28, 1987 [JP] Japan ................................. 62-335859

[51] Int. Cl.$^5$ ............................................. C25D 5/56
[52] U.S. Cl. ...................................... 428/626; 134/29; 156/668; 204/30; 204/38.4; 427/306; 427/307; 428/1; 428/458; 428/480; 428/935
[58] Field of Search ............... 204/30, 38.4; 156/668; 134/29; 427/306, 307; 428/458, 480, 626.1, 935

[56] References Cited

U.S. PATENT DOCUMENTS

| | | | |
|---|---|---|---|
| 3,652,351 | 3/1972 | Guisti | 156/668 |
| 4,067,852 | 1/1978 | Calundann | |
| 4,125,649 | 11/1978 | Donovan et al. | 427/307 |
| 4,161,470 | 7/1979 | Calundann | 260/40 P |
| 4,232,512 | 11/1980 | Yoshikawa et al. | 368/82 |
| 4,505,786 | 3/1985 | Birkmaier et al. | 204/38.4 |
| 4,520,046 | 5/1985 | McCaskie et al. | |
| 4,664,983 | 5/1977 | Nakamura et al. | 428/458 |
| 4,820,553 | 4/1989 | Sopchak et al. | 427/304 |

*Primary Examiner*—John F. Niebling
*Assistant Examiner*—William T. Leader
*Attorney, Agent, or Firm*—Burns, Doane, Swecker & Mathis

[57] ABSTRACT

Provided herein is a process for surface treatment of moldings of liquid-crystalline polyester resin which comprises roughening with an alkaline aqueous solution the surface of moldings of melt-processable polyester capable of forming an anisotropic molten phase. The roughened moldings are activated by contacting with an aqueous solution of an ampholytic surface active agent such as an aminocarboxylate. The process is intended to provide the moldings with surface characteristics suitable for surface decoration such as printing, painting, metallizing, and plating and also for bonding with an adhesive.

17 Claims, No Drawings

4,997,724

PROCESS FOR SURFACE TREATMENT OF MOLDINGS OF LIQUID-CRYSTALLINE POLYESTER RESIN

BACKGROUND OF THE INVENTION

1. Field of the Invention

The present invention relates to a process for surface treatment of moldings of melt-processable polyester resin capable of forming an anisotropic molten phase (abbreviated as "liquid-crystalline polyester" hereinafter). More particularly, it is concerned with an efficient process for surface treatment of moldings of liquid-crystalline polyester having superior heat resistance and moldability, said process being intended to provide the moldings with surface characteristics suitable for surface decoration such as printing, painting, metallizing, and plating and also for bonding with an adhesive.

2. Description of the Prior Art:

A liquid-crystalline polyester is composed of rigid, straight macromolecules unlike commonly known thermoplastic polyesters such as polybutylene terephthalate and polyethylene terephthalate. The macromolecules remain straight, with only a few entanglements, even in the molten state; therefore, they easily orient in one direction when subjected to even a small shear stress. Thus the liquid-crystalline polyester remains in the crystalline state even in the molten state or exhibits the properties of liquid crystal.

The above-mentioned liquid-crystalline polyester is chemically stabler than the common polyester resins (such as polybutylene terephthalate and polyethylene terephthalate) which do not exhibit the properties of liquid crystal. Therefore, it is not receptive to an etching solution used for the surface roughening of ordinary polyester. Even though the surface roughening is achieved in some way, the roughened surface does not have a sufficient activity for the catalyst solution for plating and hence does not undergo the subsequent electroless plating successfully. No satisfactory method has been developed yet.

The liquid-crystalline polyester may be processed by injection molding which is in general use. However, the injection-molded products have a surface layer which easily peels off and fluffs on account of strong orientation. Thus, they are not suitable as such for the secondary fabrication such as bonding, painting, and plating. A possible remedy for this is the surface roughening treatment with a chemical which is applied to ordinary resins. Unfortunately, the surface to be treated is so chemically inactive that it does not receive any solvent. Thus it is virtually impossible to remove the oriented surface layer and to make a roughened surface.

On the other hand, the liquid-crystalline polyester has unique thermal characteristics. That is, it has a low coefficient of linear expansion comparable to that of metals, and it remains normal even when dipped in a solder bath at 260° C. for 10 seconds on account of its good heat resistance. Because of these outstanding characteristics, the liquid-crystalline polyester is expected to find use as parts to be bonded to a metal part with an adhesive or as printed-circuit boards to be plated. Such parts and PC boards need surface treatment to remedy the above-mentioned disadvantageous surface characteristics. Nevertheless, no satisfactory process has been established yet.

SUMMARY OF THE INVENTION

The present invention was completed to overcome the above-mentioned problems. Accordingly, it is an object of the present invention to provide a process for surface treatment of moldings of liquid-crystalline polyester resin which comprises roughening with an alkaline aqueous solution the surface of moldings of melt-processable polyester capable of forming an anisotropic molten phase.

DESCRIPTION OF THE PREFERRED EMBODIMENTS

The present invention includes the preferred embodiments as follows:

(1) The moldings of liquid-crystalline polyester resin which have been dipped in a specific alkaline solution for surface roughening are subsequently treated with an aqueous solution containing a specific surface active agent. This surface treatment makes the surface of the moldings of liquid-crystalline polyester chemically active without any adverse effect on the thermal, physical, and chemical properties of the liquid-crystalline polyester. The chemically active surface is receptive to the catalyst indispensable for the plating on the resin surface. Thus the surface treatment is useful as the pretreatment for plating.

(2) The moldings of liquid-crystalline polyester resin to be treated with an alkaline aqueous solution are ones which are filled with 5 to 80 wt % (based on the total weight of the composition) of a specific inorganic filler. The alkaline aqueous solution (etching solution) is composed mainly of a hydroxide of an alkali metal or alkaline earth metal. The combination of the specific composition and the specific etching solution is useful to achieve the improved surface treatment of the moldings of liquid-crystalline polyester resin. This surface treatment makes the surface of the moldings of liquid-crystalline polyester chemically active without adversely affecting the thermal, physical, and chemical properties of the liquid-crystalline polyester, and also without forming the surface layers which easily peel off.

According to the present invention, the moldings may be treated in any known manner before or after the etching, or even simultaneously with the etching. For example, the moldings may be heated or dipped in hot water or a solution containing a specific compound before or after the etching. The post treatment may serve as the steps of neutralizing, washing, and drying the etching solution.

The process for surface treatment of moldings of liquid-crystalline polyester resin which is mentioned herein has many advantages. It makes the resin surface less liable to peeling. It forms a uniform, compact resin surface which is receptive to paint, adhesive, or plating. Thus, the surface-treated moldings can be bonded to metal parts or dipped in a solder bath (for about 10 seconds) unlike the conventional thermoplastic resins. The bonded parts are not disjoined because the resin has a low coefficient of linear expansion which is comparable to that of metals. The process of the present invention permits the liquid-crystalline polyester resin to be used as various parts and printed-circuit boards.

The process of the present invention is useful as pretreatment for the plating of the moldings of liquid-crystalline polyester resin. It uniformly roughens the surface of the moldings and the roughened surface is receptive to the catalyst indispensable for plating. This leads to improved platability. Thus the process of the present invention permits the liquid-crystalline polyester resin to be used as printed-circuit boards.

The above-mentioned outstanding performance is not obtained with conventional PBT. When not filled, PBT has a surface with a low degree of orientation which is easily attacked by potassium hydroxide. When filled with glass fiber, PBT is highly oriented and has a surface which is more rapidly roughened by etching than the liquid-crystalline polyester. The etched surface is so rough that it is not suitable for paint finishing and plating.

The specific surface active agent used in the present invention is one which has one or more cationic functional groups and one or more anionic functional groups in one molecule. It includes the following ampholytic surface active agents.

(1) Those belonging to the carboxybetaine type

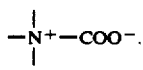

(2) Those belonging to the sulfobetaine type

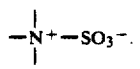

(3) Those belonging to the aminocarboxylate type—$NH_2{}^+$—$COO^{31}$.

(4) Those belonging to the imidazoline derivative type

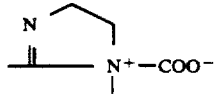

Preferable among the above-mentioned surface active agents are those of aminocarboxylate type R-NH-$(CH_2)_n$COOH ($R=C_{12-18}$, $n=1\sim2$) which have the isoelectric point in the neutral range (or weak acid).

It is assumed that the ampholytic surface active agent makes the roughened surface of liquid-crystalline polyester moldings receptive to the catalyst for plating by the following mechanism. Before subjected to surface treatment (roughening), the liquid-crystalline polyester moldings have a surface of low wettability by water in common with ordinary resin moldings. Therefore, the surface of the moldings is not receptive to the Pd-Sn colloid catalyst indispensable for electroless plating. Even though the surface tension of the catalyst solution is lowered by adding a water-soluble surface active agent, the catalyst sticks to the surface temporarily and drops off soon. When the moldings of liquid-crystalline polyester are dipped in a specific alkaline aqueous solution, the surface of the moldings undergoes hydrolysis, resulting in the formation of active polar groups on the surface. They make the surface uniformly wettable by water. In the case of filled liquid-crystalline polyester, the surface is roughened by the treatment with a specific alkaline aqueous solution, and hence becomes uniformly wettable by water. The thus formed hydrophilic surface is usually receptive to the Pd-Sn colloid in the catalyst solution for plating on account of the polar groups on the surface. However, this is not the case with liquid-crystalline polyester; it does not adsorb as much catalyst as required for plating because of its molecular structure. The adsorption of the catalyst is not improved by the use of a nonionic surface active agent or anionic surface active agent. The adsorption of the catalyst is slightly improved by the use of a cationic surface active agent; but it is not enough to produce a smooth plated surface. By contrast, the ampholytic surface active agent specified in the present invention has an anionic functional group which is easily adsorbed by the polar group on the roughened surface of liquid-crystalline polyester. The adsorbed surface active agent functions as a cationic surface active agent in the acid catalyst solution and hence easily adsorbs the catalyst. In this way, the ampholytic surface active agent permits the resin surface to adsorb the catalyst. This effect is most significantly produced by the ampholytic surface active agent of aminocarboxylate type which brings about the adsorption in the vicinity of isoelectric point.

The treatment with the ampholytic surface active agent specified in the present invention may be accomplished by dipping the moldings in an aqueous solution of the surface active agent. Spraying and coating may also be used.

According to the process of the present invention, the surface treatment is carried out with an alkaline aqueous solution. It is an aqueous solution whose principal component is an alkali metal hydroxide or alkaline earth metal hydroxide. To be more specific, it is an aqueous solution of sodium hydroxide, potassium hydroxide, lithium hydroxide, strontium hydroxide, barium hydroxide, or the like. An aqueous solution of potassium hydroxide is preferable. The alkaline aqueous solution may be used in combination with one or more than one kind of organic solvent which dissolves the decomposition products on the surface of liquid-crystalline polyester moldings and is miscible with the alkaline aqueous solution. Examples of the organic solvent include methyl alcohol, ethyl alcohol, isopropyl alcohol, isobutyl alcohol, and other alcohols; tetrahydrofuran and other furan compounds; ethylamine, dimethylamine, trimethylamine, propylamine, aniline, pyridine, formamide, and other nitrogen-containing compounds; and chlorobenzene, o-chlorobenzene, and other halogenated aromatic hydrocarbons.

For the surface treatment with the above-mentioned alkaline aqueous solution, the liquid-crystalline moldings are dipped in the solution under proper conditions selected according to the composition of the solution. Usually, dipping is accomplished in an aqueous solution containing 20–60 wt % of alkali metal hydroxide or aklaline earth metal hydroxide at 30°–80° C. for 3–120 minutes. Preferably, dipping is accomplished in a 40–50 wt % solution at 40°–60° C. for 10–30 minutes. Most desirably, dipping is accomplished in an aqueous solution containing about 45 wt % of potassium hydroxide at 60° C. for 30 minutes.

The inorganic filler used in the present invention may be any one which contains one or more elements selected from the elements belonging to Groups IIa, IIb, IIIa, IVa and Va of the Periodic Table, for example according to Lang's Handbook of Chemistry published by McGraw Hill. Preferable metals include Al, Si, Sn, Pb, Sb, Bi, Mg, Ca, Ba and Zn. Preferable are oxides, sulfates, phosphates and silicates of the elements belonging to Groups IIa and IIb. The oxides include magnesium oxide, calcium oxide, barium oxide and zinc oxide. The phosphates include magnesium phosphate, calcium phosphate, barium phosphate, zinc phosphate, magnesium pyrophosphate and calcium pyrophosphate. The sulfates include magnesium sulfate, calcium sulfate and barium sulfate. The silicates include magnesium silicate, calcium silicate, aluminum silicate, kaolin, talc, clay, diatomaceous earth and wollastonite. The phosphates are most preferred. Additional examples of the inorganic fillers include one or more members selected from amphoteric metallic elements such as aluminum, silicon, tin, lead, antimony and bismuth and oxides thereof.

The invention includes two preferable embodiments. One relates to a method for treating an article comprising a liquid crystal polyester and an inorganic filler selected from compounds of metals belonging to the groups IIa, IIb, IIIa, IVa and Va with an aqueous solution of an alkali metal hydroxide or an alkaline earth metal hydroxide. The other relates to a method for treating an article of a liquid crystal polyester with an alkaline aqueous solution and then an aqueous solution of an amphoteric surfactant, the polyester preferably including an inorganic filler selected from compounds of the metals belonging to the Group II, aluminum, silicon, tin, lead, antimony and bismuth.

In the case where the surface treatment is intended for plating as the secondary fabrication, a phosphate is preferable. In the case where the surface treatment is intended for painting as the secondary fabrication, the preferred inorganic filler is one or more members selected from the elements and oxides thereof belonging to Groups IIa, IVa, and Va of the Periodic Table. Preferred examples include zinc, aluminum, tin, and lead, and oxides thereof.

In the above-mentioned preferred embodiment (1), the inorganic filler is incorporated in an amount of 0–80 wt %, preferably 10–70 wt %, of the total amount of the liquid-crystalline polyester resin composition. Without the inorganic filler, the moldings will have flow marks on their surface and are subject to peeling. (When an adhesive tape stuck to the surface of a molding is jerked away, the surface layer is easily peeled.) Moreover, without the inorganic filler, the moldings are subject to irregular surface treatment. Conversely, with an inorganic filler in excess of 80 wt %, the resin composition is poor in flowability and cannot be made into a molded product with a good surface. The molded product becomes rough after the surface treatment and decreases in mechanical strength.

In the case of the above-mentioned preferred embodiment (2), the inorganic filler is incorporated in an amount of 5–80 wt %, preferably 20–70 wt %, of the total amount of the liquid-crystalline polyester resin composition. With an amount less than 5 wt %, the moldings will have flow marks on their surface and are subject to peeling. (When an adhesive tape stuck to the surface of a molding is jerked away, the surface layer is easily peeled.) Moreover, the moldings are subject to irregular surface treatment. Conversely, with an amount in excess of 80 wt %, the resin composition is poor in flowability and cannot be made into a molded product with a good surface. The molded product becomes rough after the surface treatment and decreases in mechanical strength.

According to the present invention, the inorganic filler should preferably be in the form of powder having an average particle diameter of 0.01 to 100 μm, preferably 0.1 to 30 μm, and most desirably 0.5 to 10 μm. With a particle diameter smaller than 0.01 μm, the inorganic filler does not disperse completely but forms agglomerates on the surface of the moldings. With a particle diameter greater than 100 μm, the inorganic filler gives rise to an excessively rough surface after the surface treatment. This leads to a poor appearance of the molded product.

The inorganic filler may be incorporated into the liquid-crystalline polyester in various manners. It is desirable to uniformly mix and disperse the inorganic filler using an extruder prior to molding.

The liquid-crystalline polyester used in the present invention is a melt-processable polyester having the characteristic properties of causing the molecule chains therein to regularly orient parallel to one another when it is in the molten state. The state in which molecules are oriented in this manner is referred to as the liquid-crystal state or the nematic phase of liquid crystal substance. A polymer like this is composed of monomers which are long, narrow, and flat, and rigid along the long axis of the molecule and have a plurality of chain extension bonds coaxial or parallel to one another.

The properties of the anisotropic molten phase can be determined by the ordinary polarization test using crossed nicols. More particularly, the properties can be determined with a Leitz polarizing microscope with 40 magnifications by observing a sample placed on a Leitz hot stage in a nitrogen atmosphere. The polymer is optically anisotropic. Namely, it transmits light when it is placed in between crossed nicols. When the sample is optically anisotropic, the polarized light can be transmitted through it even in a still state.

The constituents of the polymer that forms the above-mentioned anisotropic molten phase are as follows:

(1) One or more of aromatic and alicyclic dicarboxylic acids.

(2) One or more of aromatic, alicyclic, and aliphatic diols.

(3) One or more of aromatic hydroxycarboxylic acids.

(4) One or more of aromatic thiolcarboxylic acids.

(5) One or more of aromatic dithiols and aromatic thiolphenols.

(6) One or more of aromatic hydroxyamines and aromatic diamines.

The polymers that form the anisotropic molten phase comprise the following combinations:

(I) A polyester comprising (1) and (2).
(I) A polyester comprising (1) and (2).
(II) A polyester comprising only (3).
(III) A polyester comprising (1), (2), and (3).
(IV) A polythiol ester comprising only (4).
(V) A polythiol ester comprising (1) and (5).
(VI) A polythiol ester comprising (1), (4), and (5).
(VII) A polyester amide comprising (1), (3), and (6).
(VIII) A polyesteramide comprising (1), (2), (3), and (6).

In addition to the above-mentioned combinations of the components, the polymers that forms the anisotropic molten phase include also aromatic polyazomethines such as poly(nitrilo-2-methyl-1,4-phenylenenitriloethylidine-1,4-phenyleneethylidine), poly(nitrilo-2-methyl-1,4-phenylenenitrilomethylidine-1,4-phenylenemethylidine), and poly(nitrilo-2-chloro-1,4-phenylenenitrilomethylidine-1,4-phenylenemethylidine).

Further, in addition to the above-mentioned combinations of the components, the polymers that form the anisotropic molten phase include polyester carbonates essentially comprising 4-hydroxybenzoyl units, dihydroxyphenyl units, dihydroxycarbonyl units, and terephthaloyl units.

The above-mentioned polyesters (I), (II), and (III), and polyesteramide (VIII) which constitute the anisotropic molten phase suitable for use in the present invention can be produced by various ester-forming processes capable of reacting with each other the organic monomer compounds having functional groups which form the desired repeating units upon condensation. The functional group of the organic monomer compound includes carboxylic acid group, hydroxyl group, ester group, acyloxy group, acid halide, and amine group. These organic monomer compounds can be reacted by the melt acidolysis process in the absence of any heat exchange fluid. In this process, the monomers are heated to form a melt of reactants. As the reaction proceeds, the solid polymer particles begin to suspend in the melt. In the final stage of condensation, the reaction system may be evacuated to facilitate the removal of volatile by-products (e.g., acetic acid and water).

A slurry polymerization process may also be employed for the preparation of the liquid-crystalline polyester suitable for use in the present invention. In this process, the solid product is obtained in the form of suspension in a heat exchange medium.

The liquid-crystalline polymer suitable for use in the present invention is substantially insoluble in ordinary solvents and, therefore, it is not suitable for solution processing. However, as described above, this polymer can be processed easily by an ordinary melt processing.

The liquid-crystalline polyester suitable for use in the present invention should have a weight-average molecular weight of about 2,000 to 200,000, preferably about 10,000 to 50,000, particularly about 20,000 to 25,000. On the other hand, the preferred fully aromatic polyesteramide should have a molecular weight of about 5,000 to 50,000, preferably about 10,000 to 30,000, for example, 15,000-17,000. The molecular weight may be determined by gel permeation chromatography or other standard methods in which no polymer solution is formed, such as the method in which terminal groups of a compression-molded film are determined by infrared spectroscopy. The molecular weight may also be determined by the light-scattering method using a solution in pentafluorophenol.

The anisotropic molten phase-forming polyesters used in the present invention should preferably be aromatic polyesters and aromatic polyesteramides. Other preferred examples include those polyesters containing aromatic polyester and aromatic polyesteramide in the same molecular chain.

They are constructed of those compounds which are exemplified by naphthalene compounds such as 2,6-naphthalene dicarboxylic acid, 2,6-dihydroxynaphthalene, 1,4-dihydroxynaphthalene, and 6-hydroxy-2-naphthoic acid; biphenyl compounds such as 4,4'-diphenyldicarboxylic acid and 4,4'-dihydroxybiphenyl; those compounds represented by the following formula (I), (II), or (III).

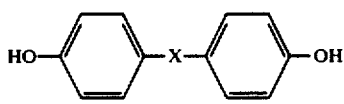
(I)

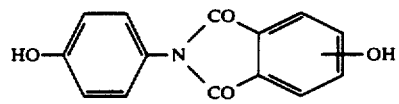
(II)

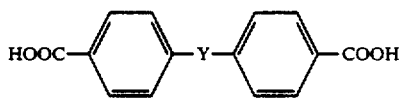
(III)

(where X is a group selected from $C_{1-4}$ alkylene, alkylidene, —O—, —SO—, —SO$_2$—, —S—, and —CO—, and Y is a group selected from —(CH$_2$)$_n$—(n=1~4) and —O(CH$_2$)$_n$O—(n=1~4).); para-substituted benzene compounds such as p-hydroxybenzoic acid, terephthalic acid, hydroquinone, p-aminophenol, and p-phenylenediamine, and nucleus-substituted benzene compounds (with the substituent group being selected from chlorine, bromine, methyl, phenyl, and 1-phenylethyl); and meta-substituted benzene compounds such as isophthalic acid and resorcinol.

The liquid-crystalline polyester used in the present invention may contain, in addition to the above-mentioned constituents, a polyalkylene terephthalate, with the alkyl group containing 2–4 carbon atoms, which does not partially exhibit the anisotropic molten phase in the same molecular chain.

The preferred example is one which contains as the essential constituents one or more than one kind of the above-mentioned naphthalene compounds, biphenyl compounds, para-substituted benzene compounds. Among the para-substituted benzene compounds, p-hydroxybenzoic acid, methyl hydroquinone, and 1-phenylethylhydroquinone are particularly preferable.

The particularly preferred anisotropic molten phase-forming polyesters used in the present invention are those which contain at least about 10 mol % of naphthalene moiety-containing recurring units such as 6-hydroxy-2-naphthoyl, 2,6-dihydroxynaphthalene, and 2,6-dicarboxynaphthalene. Preferred polyesteramides are those which have the recurring units each comprising the above-mentioned naphthalene moiety and 4-aminophenol or 1,4-phenylenediamine moiety.

For more detail about the examples of the compounds of the above-mentioned constituents (I) to (VIII) and also about the examples of the polyester which forms the anisotropic molten phase suitable for use in the present invention, refer to Japanese Patent Laid-open No. 69866/1986.

According to the present invention, the liquid-crystalline polyester may be incorporated with various kinds of inorganic substances in addition to the above-mentioned specific inorganic fillers to obtain moldings superior in mechanical properties, heat resistance, and dimensional stability (distortion and warpage resistance). They should be in the form of fiber, powder, granule, or plate selected according to the intended applications.

Examples of the fibrous fillers include inorganic fibers such as glass fiber, carbon fiber, asbestos fiber, silica fiber, silica-alumina fiber, alumina fiber, zirconia fiber, boron nitride fiber, boron silicate fiber, boron fiber, potassium titanate fiber, and metal fibers (of stainless steel, aluminum, titanium, copper, and brass). Examples of the powdery fillers include carbon black, graphite, glass beads, milled glass fiber, glass balloon, glass powder, iron oxide, alumina, metal oxide, ferrite, silicon carbide, silicon nitride, and boron nitride. Examples of the platy fillers include mica, glass flake, and metal foil. These inorganic fillers may be used alone or in combination with one another.

The inorganic substance suitable for use in combination with the inorganic filler is a fibrous inorganic substance, particularly glass fiber. It should be incorporated in an amount of 1 to 60 wt %, preferably 5 to 40 wt %, of the total amount of the molding composition. The total amount of the inorganic filler and the auxiliary inorganic substance should be within 85 wt % of the total amount of the molding composition; otherwise, they adversely affect the moldability and the physical properties of the moldings.

In the case where a fibrous inorganic substance alone is used, the resulting molding has a slightly excessive degree of surface roughness and hence unsuitable for decorative plating. The fibrous inorganic substance to be used in combination with the inorganic filler should be one which is 1 to 30 μm in diameter and 5 μm to 1 mm long, preferably 10 μm to 100 μm long. In the case where glass fiber is used in combination with the inorganic filler, it was found contrary to expectations that the resulting molding has a smooth surface which improves adhesion. This is desirable where the molding undergoes plating for the formation of electrically conductive circuits. To balance the surface roughness with the mechanical properties, it is desirable to use milled fiber glass which has the intermediate properties of glass fiber and finely ground glass. The inorganic filler and auxiliary inorganic substance should preferably be treated with greige goods or finishing agent.

The composition of the present invention may be incorporated with a conventional nucleating agent without any adverse effect. Moreover, the composition of the present invention may be incorporated with a thermoplastic resin in an amount not detrimental to the intended effect. Examples of the thermoplastic resin that can be used include polyolefins (such as polyethylene and polypropylene); polyacetal (homopolymer or copolymer); polystyrene, polyvinyl chloride, polyacrylate ester, and copolymers thereof; polyamide, polycarbonate, ABS, polyoxyphenylene oxide, polyoxyphenylene sulfide, and fluoroplastic. They be used in combination with one another.

The composition of the present invention may be incorporated with well-known substances which are commonly added to thermoplastic resins and thermosetting resins. They include a plasticizer, anti-oxidant, UV light stabilizer, anti-static agent, flame retardant, dye and pigment, lubricant (to improve flowability and releasability), and nucleating agent (to promote crystallization). They may be properly used according to the performance required.

The invention will be understood more readily by reference to the following examples; however, they are intended to illustrate the invention and are not to be construed to limit the scope of the invention.

EXAMPLES

The liquid-crystalline polyesters used in the examples are ones which have the following constituting units.

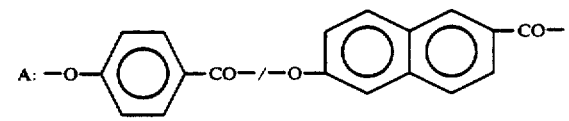
= 70/30

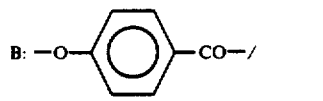

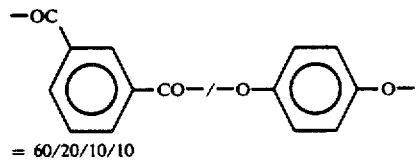
= 60/20/10/10

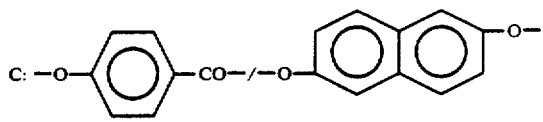

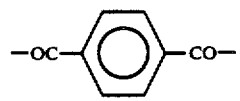
= 60/20/20

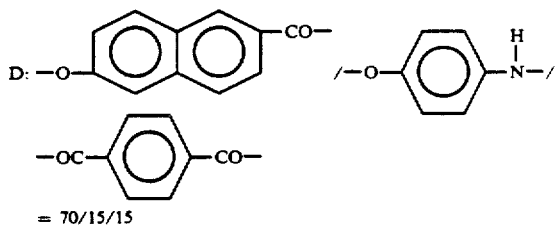
= 70/15/15

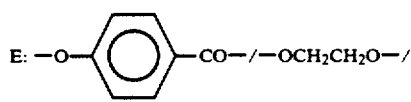

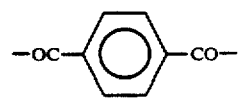
= 60/20/20

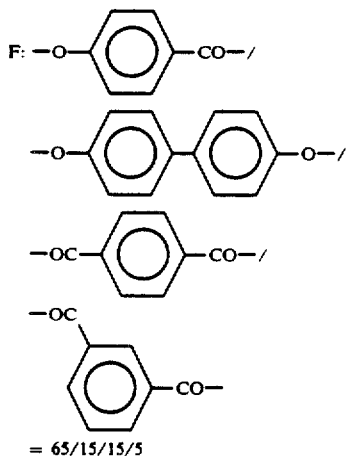

F: 
```
  —O—⟨○⟩—CO—/
  —O—⟨○⟩—⟨○⟩—O—/
  —OC—⟨○⟩—CO—/
  —OC—⟨○⟩—CO—
```
= 65/15/15/5

(The figures are in terms of molar ratio.)

EXAMPLES 1 to 8

Liquid-crystalline polyester "A" shown above was mixed with a filler as shown in Table 1 using an extruder. (The amount of the filler is expressed in terms of wt % of the total amount of the composition). The mixture was pelletized. After drying at 140° C. for 3 hours, the pellets were molded into a plaque measuring 50 by 70 by 3 mm using a mold heated to 140°-160° C. The plaque was etched under the conditions shown in Table 1. The etched plaque was plated according to the steps given later.

After etching, the residual solution on the plaque was neutralized. To activate the roughened surface, the plaque was immersed in 1 wt % solution of ampholytic surface active agent shown in Table 1. This step makes the plaque receptive to the catalyst in the subsequent step.

The surface-treated plaque underwent electroless copper plating at 25° C. for 20 minutes, followed by drying at 150° C. for 60 minutes. After standing at room temperature for one day, the adhesion of plating was observed to evaluate the effectiveness of the ampholytic surface active agent. The result is expressed in terms of the number of plaques out of ten which were completely plated.

Those plaques which had been given good electroless plating were then subjected to electroplating. The plated plaques were examined for blisters and dissolution. The plated plaques were dried at 150° C. for 60 minutes and allowed to stand at room temperature for one day. The electroplatability was evaluated by observing the adhesion of plating. The result is expressed in terms of the number of plaques out of ten which were free of blistering.

COMPARATIVE EXAMPLES 1 to 5

Plaques were prepared in the same manner as in Example 1. After etching, they were treated with a surface active agent under the conditions shown in Table 1. Plating was not satisfactory unlike that in the working examples which was carried out using an ampholytic surface active agent.

EXAMPLES 9 to 13

The same procedure as in Example 1 was repeated except that the liquid-crystalline polyester "A" was replaced by the liquid-crystalline polyesters "B" to "F" defined above. The results are shown in Table 1. It is noted that there is no difference in performance among the base polymers used.

Plating Steps Used in Examples 1 to 13 and Comparative Examples 1 to 5

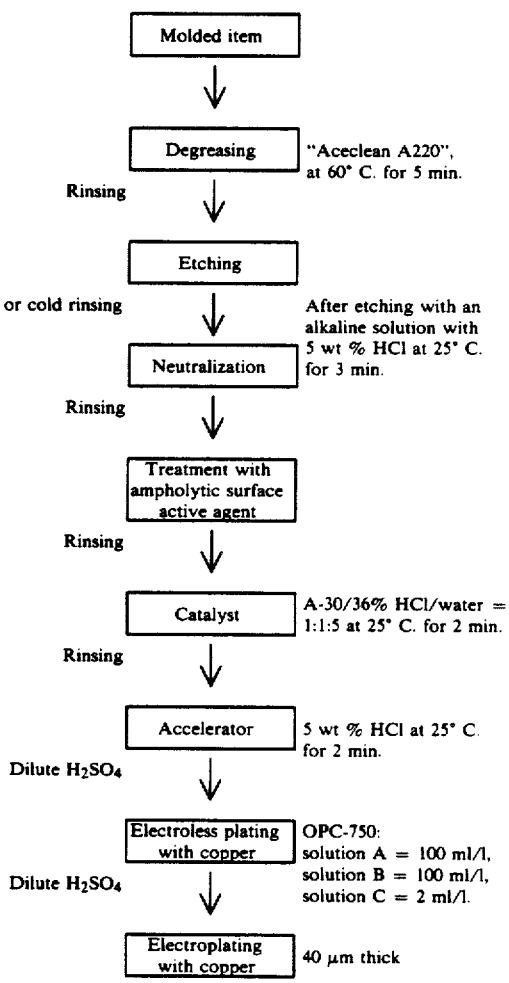

Remarks: "Aceclean A220", A-30, and OPC-750 are products of Okuno Seiyaku Kogyo Co., Ltd.

TABLE 1

| | Composition Inorganic filler | Surface roughening Solution | Conditions | Wetting Surface active agent | Conditions | Electroless-plating | Electro-plating |
|---|---|---|---|---|---|---|---|
| Example | | | | | | | |
| 1 | Calcium pyrophosphate (0.5 μm) 50 wt % | 40 wt % KOH | 60° C. × 30 min | Ampholytic (aminocarboxylate)*1 | 1 wt % 25° C. × 1 min | 10/10 | 10/10 |

TABLE 1-continued

| | Composition Inorganic filler | Surface roughening Solution | Conditions | Wetting Surface active agent | Conditions | Electroless-plating | Electro-plating |
|---|---|---|---|---|---|---|---|
| 2 | Calcium pyrophosphate (0.5 μm) 50 wt % | 50 wt % KOH | 60° C. × 30 min | Ampholytic (aminocarboxylate)*1 | 1 wt % 25° C. × 1 min | 10/10 | 10/10 |
| 3 | Calcium pyrophosphate (0.5 μm) 50 wt % | 30 wt % KOH | 60° C. × 30 min | Ampholytic (aminocarboxylate)*1 | 1 wt % 25° C. × 1 min | 10/10 | 10/10 |
| 4 | Calcium pyrophosphate (0.5 μm) 50 wt % | 15 wt % KOH | 80° C. × 120 min | Ampholytic (aminocarboxylate)*1 | 1 wt % 25° C. × 1 min | 6/10 | 5/10 |
| 5 | Calcium pyrophosphate (0.5 μm) 35 wt % Milled fiber (15 wt %) | 40 wt % KOH | 60° C. × 30 min | Ampholytic (aminocarboxylate)*1 | 1 wt % 25° C. × 1 min | 10/10 | 10/10 |
| 6 | Barium sulfate (1 μm) 15 wt % | 40 wt % KOH | 60° C. × 30 min | Ampholytic (aminocarboxylate)*1 | 1 wt % 25° C. × 1 min | 10/10 | 10/10 |
| 7 | — | 50 wt % KOH | 80° C. × 30 min | Ampholytic (aminocarboxylate)*1 | 1 wt % 25° C. × 2 min | 8/10 | 7/10 |
| 8 | Calcium pyrophosphate (0.5 μm) 50 wt % | 40 wt % KOH | 60° C. × 30 min | Ampholytic, laurylbetaine (carboxybetaine type)*2 | 1 wt % 25° C. × 3 min | 10/10 | 10/10 |

*1 "Dasper AL-1" made by Miyoshi Yushi Co., Ltd.
*2 "Anhitol 20BS" made by Kao Co., Ltd.

Comparative Example

| | Composition Inorganic filler | Surface roughening Solution | Conditions | Wetting Surface active agent | Conditions | Electroless-plating | Electro-plating |
|---|---|---|---|---|---|---|---|
| 1 | Calcium pyrophosphate (0.5 μm) 50 wt % | 40 wt % KOH | 60° C. × 30 min | Not used | — | 0/10 | 0/10 |
| 2 | Calcium pyrophosphate (0.5 μm) 50 wt % | 40 wt % KOH | 60° C. × 30 min | Anionic (sodium dodecyl-benzenesulfonate)*1 | 1 wt % 25° C. × 1 min | 0/10 | 0/10 |
| 3 | Calcium pyrophosphate (0.5 μm) 50 wt % | 40 wt % KOH | 60° C. × 30 min | Anionic (sodium alkyl-naphthalenesulfonate)*2 | 1 wt % 25° C. × 1 min | 0/10 | 0/10 |
| 4 | Calcium pyrophosphate (0.5 μm) 50 wt % | 40 wt % KOH | 60° C. × 30 min | Nonionic (polyoxyethylene-higher alcohol ether)*3 | 1 wt % 25° C. × 1 min | 0/10 | 0/10 |
| 5 | Calcium pyrophosphate (0.5 μm) 35 wt % | 40 wt % KOH | 60° C. × 30 min | Cationic (lauryl-dimethylamineoxide)*4 | 1 wt % 25° C. × 1 min | 2/10 | 1/10 |

*1 "Neoperex F-25" made by Kao Co., Ltd.
*2 "Perex HB-L" made by Kao Co., Ltd.
*3 "Emulgen 701" made by Kao Co., Ltd.
*4 "Anhitol 20" made by Kao Co., Ltd.

TABLE 2

| Example | Base polymer | Surface roughening Solution | Conditions | Wetting Surface active agent | Conditions | Electroless-plating | Electro-plating |
|---|---|---|---|---|---|---|---|
| 9 | Liquid-crystalline Polyester B | 40 wt % KOH | 60° C. × 30 min | Ampholytic (aminocarboxylate)*1 | 1 wt % 25° C. × 1 min | 10/10 | 10/10 |
| 10 | Liquid-crystalline Polyester C | 40 wt % KOH | 60° C. × 30 min | Ampholytic (aminocarboxylate)*1 | 1 wt % 25° C. × 1 min | 10/10 | 10/10 |
| 11 | Liquid-crystalline Polyester D | 40 wt % KOH | 60° C. × 30 min | Ampholytic (aminocarboxylate)*1 | 1 wt % 25° C. × 1 min | 10/10 | 10/10 |
| 12 | Liquid-crystalline Polyester E | 40 wt % KOH | 80° C. × 120 min | Ampholytic (aminocarboxylate)*1 | 1 wt % 25° C. × 1 min | 6/10 | 5/10 |
| 13 | Liquid-crystalline Polyester F | 40 wt % KOH | 60° C. × 30 min | Ampholytic (aminocarboxylate)*1 | 1 wt % 25° C. × 1 min | 10/10 | 10/10 |

*1 "Dasper AL-1" made by Miyoshi Yushi Co., Ltd.

EXAMPLES 14 to 21 and COMPARATIVE EXAMPLES 6 to 9

Liquid-crystalline polyester "A" shown above was mixed with a filler as shown in Table 3 using an extruder. The mixture was pelletized. After drying at 140° C. for 3 hours, the pellets were molded into a plaque using a mold heated to 150°-160° C. The surface properties of the plaque were evaluated in the following manner. The results are shown in Table 3.

(1) Peeling of the surface layer formed by surface orientation A piece of cellophane tape (18 mm wide, made by Nichiban Co., Ltd.) was stuck to the plaque and pressed down with a finger (about 500 g). The tape was stripped off at an angle of 90°. The surface of the plaque was visually examined for peeling.

Rating
"A" ... No peeling of surface layer
"B" ... Almost no peeling of surface layer
"C" ... Partial peeling of surface layer
"D" ... Complete peeling of surface layer (2) Flow marks on the plaque and the degree of uneven flow Evaluated by the visual examination of the plaque surface.

Rating
"A" ... Even surface
"B" ... Almost even surface

"C" ... Partially uneven surface with flow marks
"D" ... Entirely uneven surface with flow marks (3) Variation of surface roughness depending on the etching The plaque was immersed in an alkaline degreasing solution ("Aceclean A220", made by Okuno Seiyaku Co., Ltd.) at 60° C. for 5 minutes, followed by rinsing. The plaque was then etched with a 45 wt % aqueous solution of potassium hydroxide at 60° C. for 30 minutes. The etched plaque was rinsed and then immersed in a 5 wt % solution of hydrochloric acid at room temperature for 3 minutes to neutralize the residual alkali on the plaque. After rinsing, the plaque was dried at 80° C. for 15 minutes in a hot-air circulating oven. The surface roughness of the etched plaque was measured at three points on the surface with a surface roughness tester ("Surfcorder SE3C" made by Kosaka Kenkyusho).

(4) Adhesiveness of surface-treated specimen A molded dumbbell specimen conforming to ASTM was etched in the same manner as in (3) above. The specimen was cut half at the center and the cut ends were joined together with a 1-cm overlap to which was applied an epoxy adhesive ("Cemedine EP-007" two-pack type). After standing at room temperature for 24 hours, the tensile load required to break the specimen was measured using a universal tester. The tensile shear strength per cm$^2$ was obtained.

(5) Adhesion of plating on the surface-treated plaque An etched plaque (measuring 50 by 70 by 3 mm) was plated in the following manner. The plating layer was scored at an interval of 1 cm using a cutter knife. The edge of the plating layer was lifted up 90 degrees and gripped by jaws connected to a spring scale. The force required to peel the plating layer was regarded as the adhesion strength (kg/cm) of the plating layer.

Plating Steps Used in Examples 14 to 37 and Comparative Examples 6 to 14

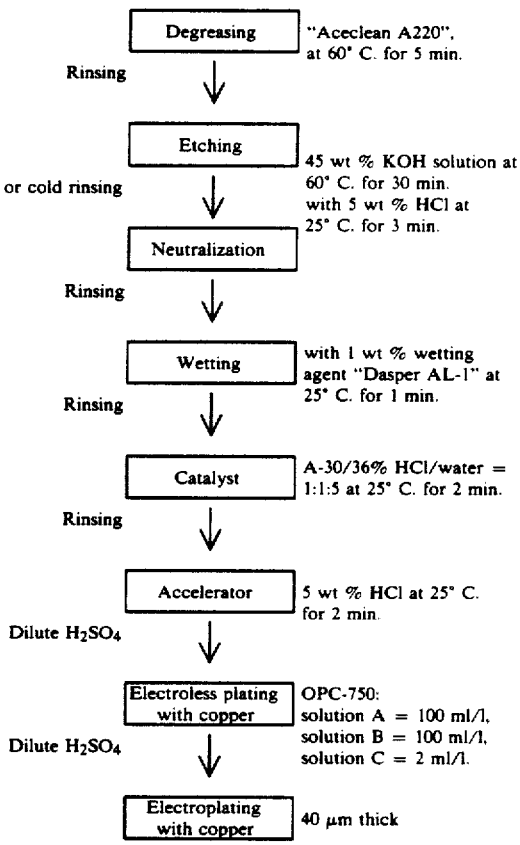

Remarks: "Aceclean A220", A-30, and OPC-750 are products of Okuno Seiyaku Kogyo Co., Ltd. "Dasper AL-1" is a product of Miyoshi Yushi Co., Ltd.

TABLE 3

| | Composition | | | Evaluation | | | | |
|---|---|---|---|---|---|---|---|---|
| | Liquid-crystalline polyester A (wt %) | Inorganic filler | Inorganic substance | Peeling of surface layer | Uniformity of surface layer | Roughness of etched surface ($R_{max}$: μm) | Bond strength after etching (kg/cm$^2$) | Adhesion of plating after etching (kg/cm) |
| Example | | | | | | | | |
| 14 | 50 | Calcium pyrophosphate (0.5 μm) 50 wt % | — | A | A | 4–5 | 132 | 1.5 |
| 15 | 50 | Calcium pyrophosphate (0.5 μm) 35 wt % | Milled fiber (15 wt %) | A | A | 8–12 | 140 | 1.7 |
| 16 | 85 | Barium sulfate (1 μm) 15 wt % | — | B | B | 4–5 | 115 | 1.0 |
| 17 | 85 | Calcium pyrophosphate (0.5 μm) 15 wt % | — | A | A | 15–20 | 118 | 1.3 |
| 18 | 50 | Barium sulfate (1 μm) 50 wt % | — | A | A | 8–12 | 128 | 1.5 |
| 19 | 50 | Barium sulfate (1 μm) 35 wt % | Glass fiber (15 wt %) | A | A | 20–30 | 141 | 1.7 |
| 20 | 50 | Zinc oxide (0.5 μm) 50 wt % | — | A | A | 6–8 | 120 | 1.3 |
| 21 | 65 | Barium sulfate (1 μm) 35 wt % | — | A | A | 6–8 | 120 | 1.2 |
| Comparative Example | | | | | | | | |

TABLE 3-continued

| | Composition | | | Evaluation | | | | |
|---|---|---|---|---|---|---|---|---|
| | Liquid-crystalline polyester A (wt %) | Inorganic filler | Inorganic substance | Peeling of surface layer | Uniformity of surface layer | Roughness of etched surface ($R_{max}$: μm) | Bond strength after etching (kg/cm$^2$) | Adhesion of plating after etching (kg/cm) |
| 6 | 100 | — | — | D | B | 2–3 | 15 | 0.2 |
| 7 | 97 | Calcium pyrophosphate (0.5 μm) 35 wt % | — | C | D | 5–10 | 42 | 0.5 |
| 8 | 70 | — | Glass fiber (30 wt %) | B | C | 30–40 | 85 | 0.7 |
| 9 | 50 | — | Glass beads (50 μm) 50 wt % | B | B | 20–30 | 98 | 0.6 |

EXAMPLES 22 to 26

The same procedure as in Example 15 was repeated except that the liquid-crystalline polyester "A" was replaced by the liquid-crystalline polyesters "B" to "F" defined above. The results are shown in Table 4.

TABLE 4

| | | Evaluation | | | | |
|---|---|---|---|---|---|---|
| Example | Base polymer | Temperature (°C.) | Time (min) | Roughness of etched surface ($R_{max}$: μm) | Bond strength after etching (kg/cm$^2$) | Adhesion of plating after etching (kg/cm) |
| 22 | Liquid-crystalline polyester B | A | A | 10–15 | 132 | 1.6 |
| 23 | Liquid-crystalline polyester C | A | A | 8–12 | 140 | 1.4 |
| 24 | Liquid-crystalline polyester D | A | A | 8–12 | 138 | 1.5 |
| 25 | Liquid-crystalline polyester E | A | A | 10–15 | 130 | 1.6 |
| 26 | Liquid-crystalline polyester F | A | A | 6–8 | 122 | 1.3 |

EXAMPLES 27 to 32

The same material as used in Example 17 was formed into a plaque measuring 50 by 70 by 3 mm. The plaque was etched with different kinds of etching solutions, and the surface treatability was evaluated. The results are shown in Table 5.

EXAMPLE 33

The adhesion of the plating layer was evaluated using the plated specimen obtained in Example 9. With the plating layer scored at an interval of 10 mm, the specimen was dipped in a solder bath at 260° C. for 10 seconds. The specimen retained an adhesion strength of 1.5 kg/cm after dipping.

EXAMPLES 34 to 37 and COMPARATIVE EXAMPLES 10 to 12

Liquid-crystalline polyester "A" shown above was mixed with a filler as shown in Table 6 using an extruder. The mixture was pelletized, and the pellets were molded into a test piece in the same manner as in Example 14. The surface properties and other physical properties were evaluated in the same manner as in Example 14 and also in the following manner. The results are shown in Table 6.

(6) Strength of material The strength of the molded test piece was measured according to ASTM D638.

(7) Paintability of the surface-treated molded item The molded item was etched in the same manner as in (3) and then coated with a commercial urethane paint ("Urethane PG60", a product of Kansai Paint Co., Ltd.) so that the dry film has a thickness of 30±10 μm. The coated specimen was dried at 100° C. for 60 minutes and then allowed to stand at room temperature for 1 day. The adhesion of the coating film was evaluated by cross-cut test. The rating is expressed in terms of the number of unpeeled pieces out of 100 pieces (each measuring 1 by 1 mm).

TABLE 5

| | Composition of etching solution | | Etching conditions | | Evaluation | | |
|---|---|---|---|---|---|---|---|
| Example | Major Component | Solvent added | Temperature (°C.) | Time (min) | Roughness of etched surface ($R_{max}$: μm) | Bond strength after etching (kg/cm$^2$) | Adhesion of plating after etching (kg/cm) |
| 27 | 50 wt % NaOH | — | 80 | 60 | 8–12 | 132 | 1.4 |
| 28 | 50 wt % NaOH | CH$_3$OH (equal in volume to 50 wt % NaOH solution) | 40 | 60 | 6–8 | 138 | 1.5 |
| 29 | 40 wt % KOH | — | 60 | 30 | 8–12 | 140 | 1.7 |
| 30 | 40 wt % KOH | Tetrahydrofuran (quarter by volume of 50 wt % KOH solution) | 40 | 60 | 6–10 | 142 | 1.9 |
| 31 | 40 wt % KOH | CH$_3$OH (equal in volume to 40 wt % KOH solution) | 40 | 60 | 6–10 | 139 | 1.8 |
| 32 | 20 wt % KOH | — | 80 | 40 | 4–6 | 131 | 1.4 |

TABLE 6

| Example No. | Liquid-crystalline polyester A (wt %) | Inorganic filler | Inorganic substance | Peeling of surface layer | Strength of material (kg/cm$^2$) | Paintability after etching |
|---|---|---|---|---|---|---|
| Example 34 | 70 | Calcium pyrophosphate (50 wt %) | — | B | 1050 | 100/100 |
| Example 35 | 50 | Calcium pyrophosphate (30 wt %) | Glass fiber (20 wt %) | A | 1120 | 100/100 |
| Example 36 | 70 | Zinc oxide (30 wt %) | — | B | 1020 | 100/100 |
| Example 37 | 70 | Aluminum oxide (30 wt %) | — | B | 970 | 100/100 |
| Comparative Example 10 | 70 | Titanium oxide (30 wt %) | — | C | 670 | 80/100 |
| Comparative Example 11 | 70 | Calcium carbonate (30 wt %) | — | D | 560 | 95/100 |
| Comparative Example 12 | 100 | — | — | D | 1600 | 60/100 |

COMPARATIVE EXAMPLES 13 and 14

In Comparative Example 13, the same procedure as in Example 15 was repeated except that the liquid-crystalline polyester was replaced by an ordinary thermoplastic polyester (polybutylene terephthalate (PBT), "Juranex", a product of Polyplastics Co., Ltd.). In Comparative Example 14, the same procedure as above was repeated except that the filler was not used. The results are shown in Table 7.

TABLE 7

| Comparative Example | PBT (wt %) | Inorganic filler | Inorganic substance | Peeling of surface layer | Uniformity of surface layer | Roughness of etched surface (R$_{max}$: μm) | Bond strength after etching (kg/cm$^2$) | Adhesion of plating after etching (kg/cm) | Paintability after etching |
|---|---|---|---|---|---|---|---|---|---|
| 13 | 50 | Calcium pyrophosphate (0.5 μm) 35 wt % | Milled fiber 15 wt % | A | A | 20–30 | 42 | 0.3 | 100/100 |
| 14 | 100 | — | — | A | A | 4–5 | 30 | 0.5 | 100/100 |

What is claimed is:

1. A process for the surface treatment of a molded article comprising a liquid crystalline polyester which is capable of forming an anisotropic melt phase so as to render the surface well suited for finishing comprising the steps of (a) providing 5 to 80 percent by weight of at least one particulate inorganic filler selected from the oxides, sulfates, phosphates, and silicates of elements belonging to Groups IIa, IIb, IIIa, IVa, and Va of the Periodic Table and metallic elements selected from the group consisting of aluminum, silicon, tin, lead, antimony, and bismuth, dispersed throughout the liquid crystalline polyester when molten at the time of molding to form a molded article having a surface layer consisting of substantially oriented polymeric molecules in association with the inorganic filler, with the concentration of inorganic filler being based upon the total weight of the molding composition, (b) roughening the surface of the resulting molded article comprising said liquid crystalline polyester by contact for a sufficient period of time with an aqueous alkaline solution, and (c) thereafter activating the surface of the resulting molded article comprising said liquid crystalline polyester to render it well receptive for finishing by contact with an effective concentration of an aqueous solution consisting essentially of water and an aminocarboxylate ampholytic surface active agent.

2. A process for the surface treatment of a molded article comprising a liquid crystalline polyester so as to render the surface well suited for finishing according to claim 1 wherein said aminocarboxylate ampholytic surface active agent possesses the formula R—N-H—(CH$_2$)$_n$COOH, where R is C$_{12}$ to C$_{18}$ and n is selected from the group consisting of 1 and 2.

3. A process for the surface treatment of a molded article comprising a liquid crystalline polyester so as to render the surface well suited for finishing according to claim 1 wherein said liquid crystalline polyester contains at least 10 mole percent of recurring naphthalene units selected from the group consisting of 6-oxy-2-naphthoyl units, 2,6-dioxynaphthalene units, and 2,6-dicarboxynaphthalene units.

4. A process for the surface treatment of a molded article comprising a liquid crystalline polyester so as to render the surface well suited for finishing according to claim 1 wherein said liquid crystalline polyester comprises 70 mole percent of recurring 4-oxybenzoyl units and 30 mole percent of recurring 6-oxy-2-naphthoyl units.

5. A process for the surface treatment of a molded article comprising a liquid crystalline polyester so as to render the surface well suited for finishing according to claim 1 wherein said inorganic filler is provided in a concentration of 20 to 70 percent by weight based upon the total weight of the molding composition.

6. A process for the surface treatment of a molded article comprising a liquid crystalline polyester so as to render the surface well suited for finishing according to claim 1 wherein said particulate inorganic filler is selected from the group consisting of oxides, sulfates, phosphates, and silicates of elements belonging to Groups IIa and IIb of the Periodic Table.

7. A process for the surface treatment of a molded article comprising a liquid crystalline polyester so as to render the surface well suited for finishing according to claim 6 wherein said particulate inorganic filler is a phosphate.

8. A process for the surface treatment of a molded article comprising a liquid crystalline polyester so as to render the surface well suited for finishing according to claim 1 wherein said particulate inorganic filler is selected from the group consisting of oxides of metallic elements belonging to Groups IIIa, IVa, and Va of the Periodic Table; aluminum; silicon; tin; lead; antimony and bismuth.

9. A process for the surface treatment of a molded article comprising a liquid crystalline polyester so as to render the surface well suited for finishing according to claim 1 wherein said aqueous alkaline solution is an aqueous solution containing at least 20 percent by weight of a hydroxide selected from the group consisting of an alkali metal hydroxide and an alkaline earth metal hydroxide.

10. A process for the surface treatment of a molded article comprising a liquid crystalline polyester so as to render the surface well suited for finishing according to claim 9 wherein said aqueous alkaline solution is an aqueous solution of potassium hydroxide.

11. A process for the surface treatment of a molded article comprising a liquid crystalline polyester so as to render the surface well suited for finishing according to claim 1 wherein the aqueous alkaline solution of step (b) comprises 20 to 60 percent by weight of a hydroxide selected from the group consisting of an alkali metal hydroxide and an alkaline earth metal hydroxide, and the molded article is contacted with said solution for 3 to 120 minutes while at a temperature of 30° to 80° C.

12. A process for the surface treatment of a molded article comprising a liquid crystalline polyester so as to render the surface well suited for finishing according to claim 1 wherein the aqueous alkaline solution of step (b) comprises 40 to 50 percent by weight of a hydroxide selected from the group consisting of an alkali metal hydroxide and an alkaline earth metal hydroxide, and the molded article is contacted with said solution for 10 to 30 minutes while at a temperature of 40° to 60° C.

13. A process for the surface treatment of a molded article comprising a liquid crystalline polyester so as to render the surface well suited for finishing according to claim 1 wherein the aqueous solution of step (b) comprises approximately 45 percent by weight of potassium hydroxide, and the molded article is contacted with said solution for 30 minutes while at 60° C.

14. A process for the surface treatment of a molded article comprising a liquid crystalline polyester so as to render the surface well suited for finishing according to claim 1 wherein said particulate inorganic filler is in the form of a fine powder having an average particle diameter of 0.01 to 100 $\mu$m.

15. A process for the surface treatment of a molded article comprising a liquid crystalline polyester so as to render the surface well suited for finishing according to claim 1 wherein said particulate inorganic filler comprises 1 to 60 percent by weight based upon the total weight of the molding composition of a fibrous inorganic filler having a diameter of 1 to 30 $\mu$m and a length of 5 $\mu$m to 1 mm.

16. A process for the surface treatment of a molded article comprising a liquid crystalline polyester so as to render the surface well suited for finishing according to claim 1 which includes the additional step (d) of subsequently subjecting the surface of the molded article to a finishing step selected from the group consisting of printing, painting, metallizing, and plating.

17. A molded article comprising a liquid crystalline polymer which bears a uniform well-adhering finish upon the surface thereof formed in accordance with the process of claim 16.

* * * * *